United States Patent
Hiar et al.

(10) Patent No.: US 7,738,075 B2
(45) Date of Patent: Jun. 15, 2010

(54) LITHOGRAPHIC ATTRIBUTE ENHANCEMENT

(75) Inventors: Todd D. Hiar, Gilbert, AZ (US); Theodore A. Paxton, Chandler, AZ (US); Todd J. Davis, Gilbert, AZ (US); Cassandra M. Owen, Chandler, AZ (US)

(73) Assignee: ASML Netherlands B.V., Veldhoven (NL)

( * ) Notice: Subject to any disclaimer, the term of this patent is extended or adjusted under 35 U.S.C. 154(b) by 222 days.

(21) Appl. No.: 11/134,625

(22) Filed: May 23, 2005

(65) Prior Publication Data

US 2006/0262287 A1 Nov. 23, 2006

(51) Int. Cl.
G03B 27/52 (2006.01)
G03B 27/32 (2006.01)
(52) U.S. Cl. .......................... 355/30; 355/77
(58) Field of Classification Search .................. 355/30, 355/53, 72, 77, 75; 702/136; 430/30
See application file for complete search history.

(56) References Cited

U.S. PATENT DOCUMENTS

| 5,079,600 | A | 1/1992 | Schnur et al. |
| 5,229,872 | A | 7/1993 | Mumola |
| 5,296,891 | A | 3/1994 | Vogt et al. |
| 5,324,591 | A | 6/1994 | Georger et al. |
| 5,523,193 | A | 6/1996 | Nelson |
| 5,969,441 | A | 10/1999 | Loopstra et al. |
| 6,046,792 | A | 4/2000 | Van Der Werf et al. |
| 6,873,938 | B1 | 3/2005 | Paxton et al. |
| 7,510,341 | B2 | 3/2009 | Hayasaki et al. |
| 2002/0081758 | A1 | 6/2002 | Iriki |
| 2006/0222975 | A1* | 10/2006 | Ke et al. .................. 430/30 |
| 2006/0241891 | A1* | 10/2006 | Kaushal et al. ............ 702/136 |

FOREIGN PATENT DOCUMENTS

| JP | 10-74678 A | 3/1998 |
| JP | 2004-273586 A | 9/2004 |
| JP | 2005-026362 A | 1/2005 |
| WO | WO 98/40791 | 9/1998 |

OTHER PUBLICATIONS

D.G. Flagello et al., "Understanding Systematic and Random CD variations using Predictive Modelling Techniques," *SPIE*, vol. 3679, pp. 162-175.
Notice of Reasons for Rejection in Japanese Patent Application No. 2006-141464 mailed May 7, 2009, 3 pgs.

* cited by examiner

*Primary Examiner*—Peter B Kim
(74) *Attorney, Agent, or Firm*—Sterne, Kessler, Goldstein & Fox P.L.L.C.

(57) ABSTRACT

A method, computer program product, and apparatus configured to improve attribute uniformity of a substrate is disclosed. In an embodiment, the method involves calculating corrective data based on measured values of an attribute of a substrate processed by a lithographic exposure apparatus, the corrective data configured to at least partially correct non-uniformity of the values of the substrate attribute by controlling the temperature generated by a zone of a thermal plate used to heat or cool the substrate, and making the corrective data available to the thermal plate.

29 Claims, 6 Drawing Sheets

LITHOGRAPHIC ATTRIBUTE ENHANCEMENT

FIELD

The present invention generally relates to lithographic systems and methods of lithographic exposure.

BACKGROUND

A lithographic exposure apparatus is a machine that applies a desired pattern onto a target portion of a substrate. Lithographic exposure apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic exposure apparatus include so-called steppers, in which each target portion is irradiated by exposing an entire pattern onto the target portion at one time, and so-called scanners, in which each target portion is irradiated by scanning the pattern through the projection beam in a given direction (the "scanning"-direction) while synchronously scanning the substrate parallel or anti-parallel to this direction.

Irrespective of the tool used, the substrate may be subjected to a variety of processes before the exposure process. For example, as indicated above, the substrate will generally be treated with resist before exposure. Also, prior to exposure, the substrate may be subjected to cleaning, etching, ion implantation (e.g., doping), metallization, oxidation, chemo-mechanical polishing, priming, resist coating, soft bake processes, and measurement processes.

The substrate may also be subjected to a host of post-exposure processes, such as, for example, post exposure bake (PEB), development, hard bake, etching, ion implantation (e.g., doping), metallization, oxidation, chemo-mechanical polishing, cleaning, and measurement processes. And, if several layers are required, which is usually the case, the entire procedure, or variants thereof, will have to be repeated for each new layer.

These pre- and post-exposure processes are typically performed by stations or modules designed for their respective purposes. The substrate is subjected to these processing modules, as well as the lithographic exposure apparatus, typically in a pre-defined sequence. In this arrangement, the substrates travel in a pre-specified processing path to get serviced by specific processing modules that can be tracked. The processing path can be monitored, recorded, controlled, and limited to specific paths.

Figure 1:
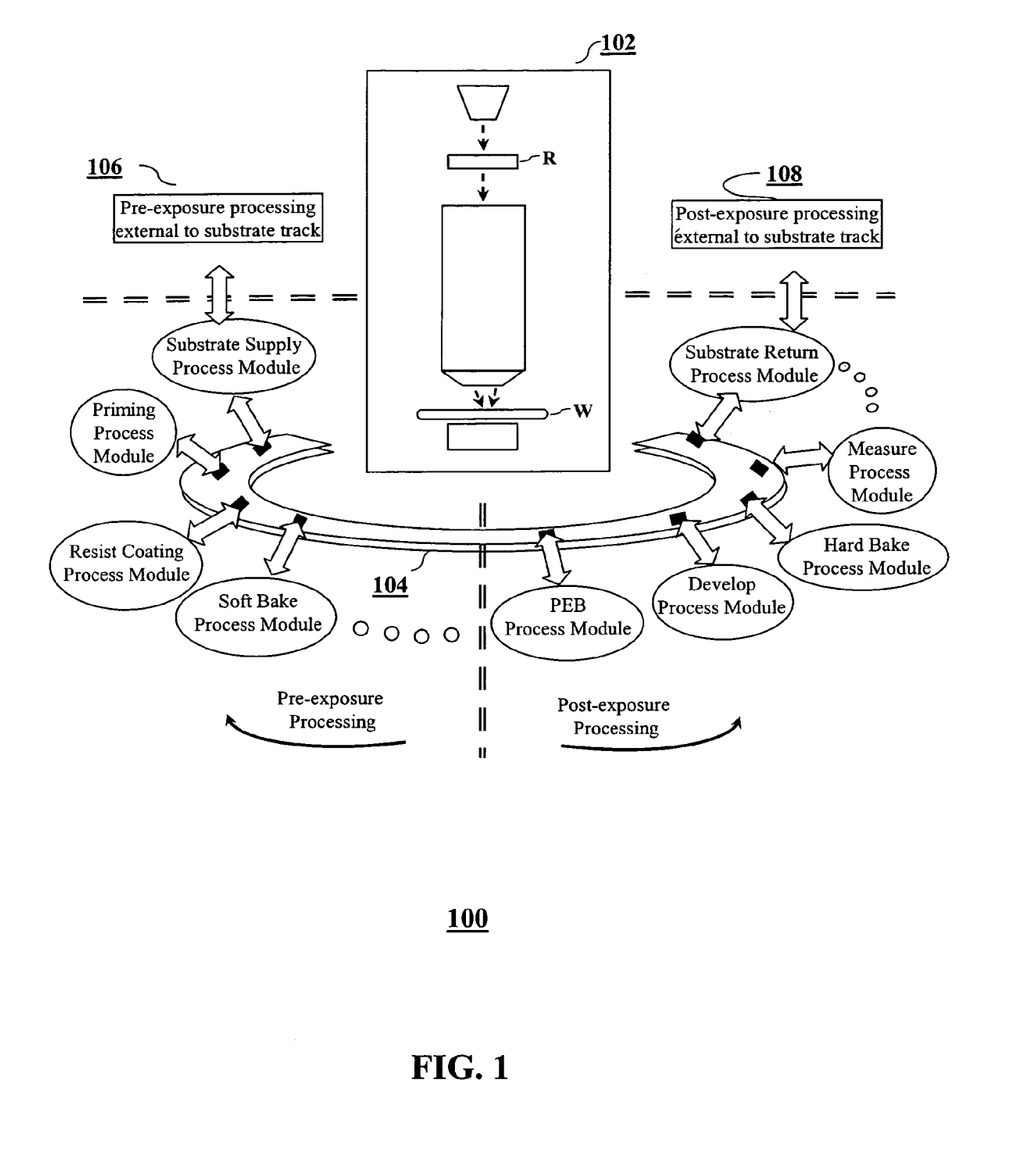
FIG. 1 is a schematic illustration of a lithographic system.

As indicated in FIG. 1A, which schematically depicts a lithographic system 100, substrate track apparatus 104 interconnects lithographic exposure apparatus 102 with a host of pre-processing modules 104, 106 and post exposure processing modules 104, 108. The pre- and post-exposure processing modules 104, 106, 108 may be apparatus that are external and/or internal to the substrate track 104. To accommodate the transfer of substrates between these processing apparatus, the substrate track 104 may include interface sections and apparatus configured to transport the substrates to and from the lithographic exposure apparatus 102, pre-processing apparatus 106, and post-processing apparatus 108, and include transport apparatus to move the substrates between the various processing modules internal to the substrate track 104. Pre-exposure processes typically performed by apparatus external to the substrate track 106 may include, for example, cleaning, etching, ion implantation (e.g., doping), metallization, oxidation, chemo-mechanical polishing, and measurement. Pre-exposure processes typically performed by apparatus internal to the substrate track 104 may include, for example, substrate supply, resist coating, measurement, and soft bake. Post-exposure processes typically performed by apparatus internal to the substrate track 104 may include, for example, post-exposure bake (PEB), hard bake, and measurement. Post-exposure processes typically performed by apparatus external to the substrate track 108 may include, for example, cleaning, etching, ion implantation (e.g., doping), metallization, oxidation, chemo-mechanical polishing, and measurement.

To facilitate manufacture of a good substrate, the features and profile of the pattern exposed on the target field of the substrate are replicated as accurately as possible. To this end, one or more attributes of the exposed features on the substrate are typically specified in order to characterize the features and profile of the pattern and establish a benchmark level of quality and/or uniformity. The attributes may include, for example, the gap between features, X and/or Y diameter of holes and/or posts, ellipticity of holes and/or posts, area of feature, feature sidewall angle, width at the top of a feature, width at the middle of a feature, width at the bottom of a feature, and line edge roughness.

There are, however, numerous activities during the lithographic fabrication process that may affect attribute uniformity and/or compromise the quality of the exposed pattern. For example, the very pre- and post-exposure processes that service and treat the substrates along the substrate track, such as the post exposure bake (PEB) processing module, may contribute to variation in attribute uniformity. Such a variation may occur across a target field, across a substrate, and between substrates and ultimately result in loss of yield.

SUMMARY

Accordingly, it would be advantageous, for example, to provide one or methods, computer program products, and/or apparatus to improve attribute uniformity of a substrate.

According to an aspect of the invention, there is provided a method of improving attribute uniformity of a substrate, comprising calculating corrective data based on measured values of an attribute of a substrate processed by a lithographic exposure apparatus, the corrective data configured to at least partially correct non-uniformity of the values of the substrate attribute by controlling the temperature generated by a zone of a thermal plate used to heat or cool the substrate, and making the corrective data available to the thermal plate.

According to another aspect of the invention, there is provided a computer readable program product encoded with instructions that, when executed by a computer, performs a method of improving attribute uniformity of a substrate, comprising calculating corrective data based on measured values of an attribute of a substrate processed by a lithographic exposure apparatus, the corrective data configured to at least partially correct non-uniformity of the values of the substrate attribute by controlling the temperature generated by a zone of a thermal plate used to heat or cool the substrate, and making the corrective data available to the thermal plate.

According to another aspect of the invention, there is provided a thermal plate system, comprising:

a thermal plate configured to heat or cool a substrate and comprising a plurality of zones; and a controller configured to calculate corrective data based on measured values of an attribute of a substrate and to control the temperature generated by a zone of the plurality of zones based on the corrective data, the corrective data configured to at least partially correct non-uniformity of the values of the substrate attribute.

According to further aspect of the invention, there is provided a lithographic apparatus, comprising:

a projection system configured to project a patterned beam of radiation onto a substrate;

a substrate holder configured to hold the substrate;

a thermal plate configured to heat or cool a substrate and comprising a plurality of zones; and a controller configured to calculate corrective data based on measured values of an attribute of a substrate and to control the temperature generated by a zone of the plurality of zones based on the corrective data, the corrective data configured to at least partially correct non-uniformity of the values of the substrate attribute.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

FIG. 1 schematically depicts a lithographic system 100 according to an embodiment of the invention. System 100 comprises a lithographic exposure apparatus 102, which is configured to expose a pattern onto a substrate, and a substrate track 104, which is configured to transport the substrates between various pre- and post-exposure processing modules, whether internal or external to the substrate track.

Figure 2:
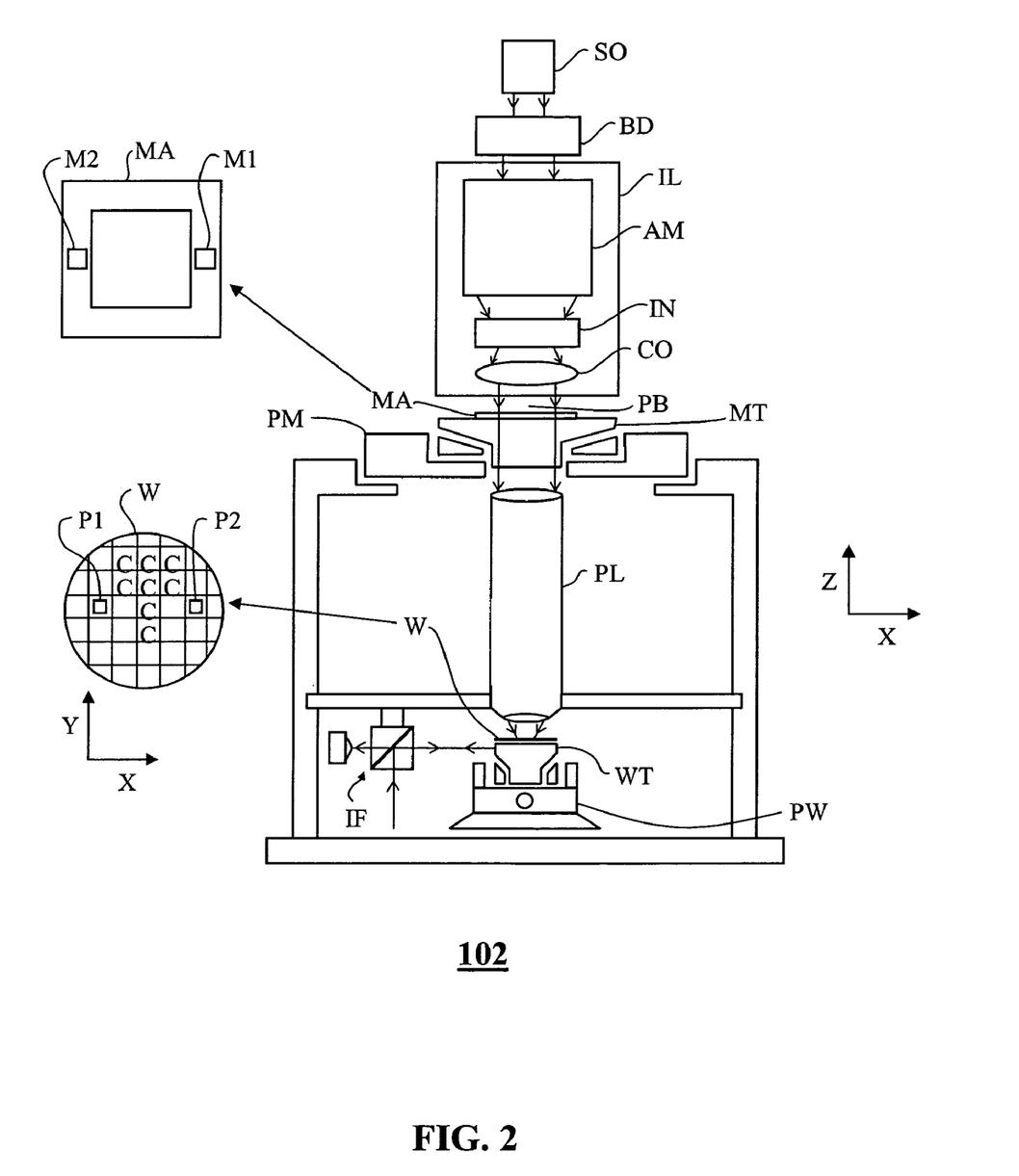
FIG. 2 is a schematic illustration of a lithographic projection apparatus.

FIG. 2 provides a more detailed schematic illustration of an embodiment of lithographic exposure apparatus 102. The lithographic exposure apparatus 102 comprises:

an illumination system (illuminator) IL adapted to condition a beam PB of radiation (e.g. UV radiation);

a support structure (e.g. a mask table) MT configured to hold a patterning device (e.g. a mask) MA and connected to first positioning device PM configured to accurately position the patterning device with respect to item PL;

a substrate table (e.g. a wafer table) WT configured to hold a substrate (e.g. a resist-coated wafer) W and connected to second positioning device PW configured to accurately position the substrate with respect to item PL; and a projection system (e.g. a refractive projection lens) PL adapted to image a pattern imparted to the beam PB by the patterning device MA onto a target portion C (e.g. comprising one or more dies) of the substrate W.

As here depicted, the lithographic exposure apparatus is of a transmissive type (e.g. employing a transmissive mask). Alternatively, the lithographic exposure apparatus may be of a reflective type (e.g. employing a programmable mirror array of a type as referred to above).

The illuminator IL receives a beam of radiation from a radiation source SO. The source and the lithographic exposure apparatus may be separate entities, for example when the source is an excimer laser. In such cases, the source is not considered to form part of the lithographic exposure apparatus and the radiation beam is passed from the source SO to the illuminator IL with the aid of a beam delivery system BD comprising for example suitable directing mirrors and/or a beam expander. In other cases the source may be integral part of the lithographic exposure apparatus, for example when the source is a mercury lamp. The source SO and the illuminator IL, together with the beam delivery system BD if required, may be referred to as a radiation system.

The illuminator IL may comprise an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the patterning device MA, which is held on the support structure MT. Having traversed the patterning device MA, the projection beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the support structure MT and the substrate table WT will be realized with the aid of a long-stroke module (coarse positioning) and a short-stroke module (fine positioning), which form part of the one or both of the positioning devices PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted lithographic exposure apparatus can be used in the following preferred modes:

1. In step mode, the support structure MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the projection beam is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

As noted above, processes that treat the substrate may contribute to a variation in values of one or more lithographic attributes that could negatively affect the quality and performance of the exposed patterns. Such non-uniformities may occur across a target field, across a substrate, and between substrates. Moreover, these non-uniformities can also vary depending on a variety of factors, such as the particular path the substrate travels, scheduling anomalies, etc. As described in greater detail below, an embodiment of the invention contemplates an attribute enhancement process whereby these non-uniformities may be reduced to provide an acceptable attribute uniformity level. Such a process exploits information regarding the lithographic system, for example, substrate track processing data, metrology data, and/or substrate history data, to arrive at and maintain optimal corrective data to improve overall attribute uniformity performance.

In an embodiment, a thermal plate, such as a bake plate, a chill plate, or a combination thereof, may cause such non-uniformities yet may also be used to improve attribute uniformity as further described below. In current systems, a thermal plate is typically calibrated using one or more thermal sensors on installation to verify that temperature uniformity across the plate is within the thermal plate's specification. However, this calibration is an indirect measure of the performance of the thermal plate—the calibration is not used to improve the temperature uniformity across the thermal plate beyond the thermal plate's specifications or to improve substrate attribute uniformity beyond attempting to achieve temperature uniformity across the thermal plate. Moreover, the calibration occurs at a single point in time and the temperature uniformity across the thermal plate may vary over time or according to use. Indeed, in some circumstances, a "best" individual thermal plate (i.e., a thermal plate with good temperature uniformity across the thermal plate that is able to maintain that uniformity over time and use) within a lithographic system may be selected to process most, if not all, substrates to improve attribute uniformity at the cost of a significant reduction in throughput.

As noted above, attribute non-uniformity of substrates may arise from non-uniformities within the thermal plate or from other processes or devices used to process the substrates. Often, the attribute non-uniformity has a repeatable signature ("finger print") based on the specific modules ("path") used to process a given substrate. By being able to identify the finger print, corrections may be applied to reduce or eliminate the fingerprint to improve attribute uniformity. In an implementation, such corrections are applied to improve the temperature uniformity of many, if not all, the thermal plates used to process substrates in the lithographic system, thus allowing for improvement of attribute uniformity at higher throughput than if only one "best" thermal plate were selected to process substrates.

In an embodiment of the invention, direct measurements of one or more substrate attributes of substrate features, whether test or production features, are obtained and used to optimize the performance of one or more thermal plates, in addition to or as an alternative to typical temperature measurements of the thermal plate(s). In particular, the measurements of the one or more attributes are evaluated to determine corrections to be made within the thermal plate(s) to improve the temperature uniformity across the thermal plate(s) or to implement a temperature variation across the thermal plate(s), in each case to improve or control attribute uniformity. To implement the corrections, one or more thermal zones within the thermal plate would be controlled.

A typical thermal plate is composed of multiple thermal (heating and/or cooling) zones that are cycled on and off by a thermal plate controller. These zones are sometimes referenced as elements and the term zones herein shall be considered as synonymous with the term elements. Thus, the thermal plate can have varying temperatures across the surface of the thermal plate due to the zones. However, the controller allows input of an offset for each of these zones. So, for example, during calibration as described above, one or more zones may be determined not to reach a desired temperature and so offsets may be applied to one or more of the zones to improve temperature uniformity across the substrate. By applying new or adjusting (increasing or decreasing) existing offsets of individual zones within the thermal plate controller, the corrections described above may be implemented to improve the temperature uniformity across the thermal plate or to implement a temperature variation across the thermal plate, in each case to improve or control attribute uniformity. The result is that attribute non-uniformity caused by processes or apparatus within the lithographic system may be compensated for by adjusting the temperature uniformity of the thermal plate.

In an embodiment, and as described in more detail below, the attribute uniformity improvement method is automated and operates in real time or near real time to update and/or maintain the zone offsets of one or more thermal plates based on attribute data obtained from previously exposed substrates. Such attribute data may be obtained from one or more metrology tools external to the track and/or lithographic exposure apparatus or advantageously from one or more measurement systems implemented in the track and/or lithographic exposure apparatus. While the one or more thermal plates discussed herein that are corrected will be typically located within the substrate track, an embodiment of the invention may be additionally or alternatively be implemented to one or more thermal plates within the lithographic exposure apparatus or outside of the track and the lithographic exposure apparatus. In an embodiment, the thermal plate correction method may be applied in addition to or as an alternative to other techniques used to improve attribute uniformity, such as extended exposure techniques, as described in U.S. Pat. No. 6,873,938, issued Mar. 29, 2005, incorporated in its entirety herein by reference, and dose mapping techniques as provided for in ASML's Dose Mapper software product.

Figure 3:
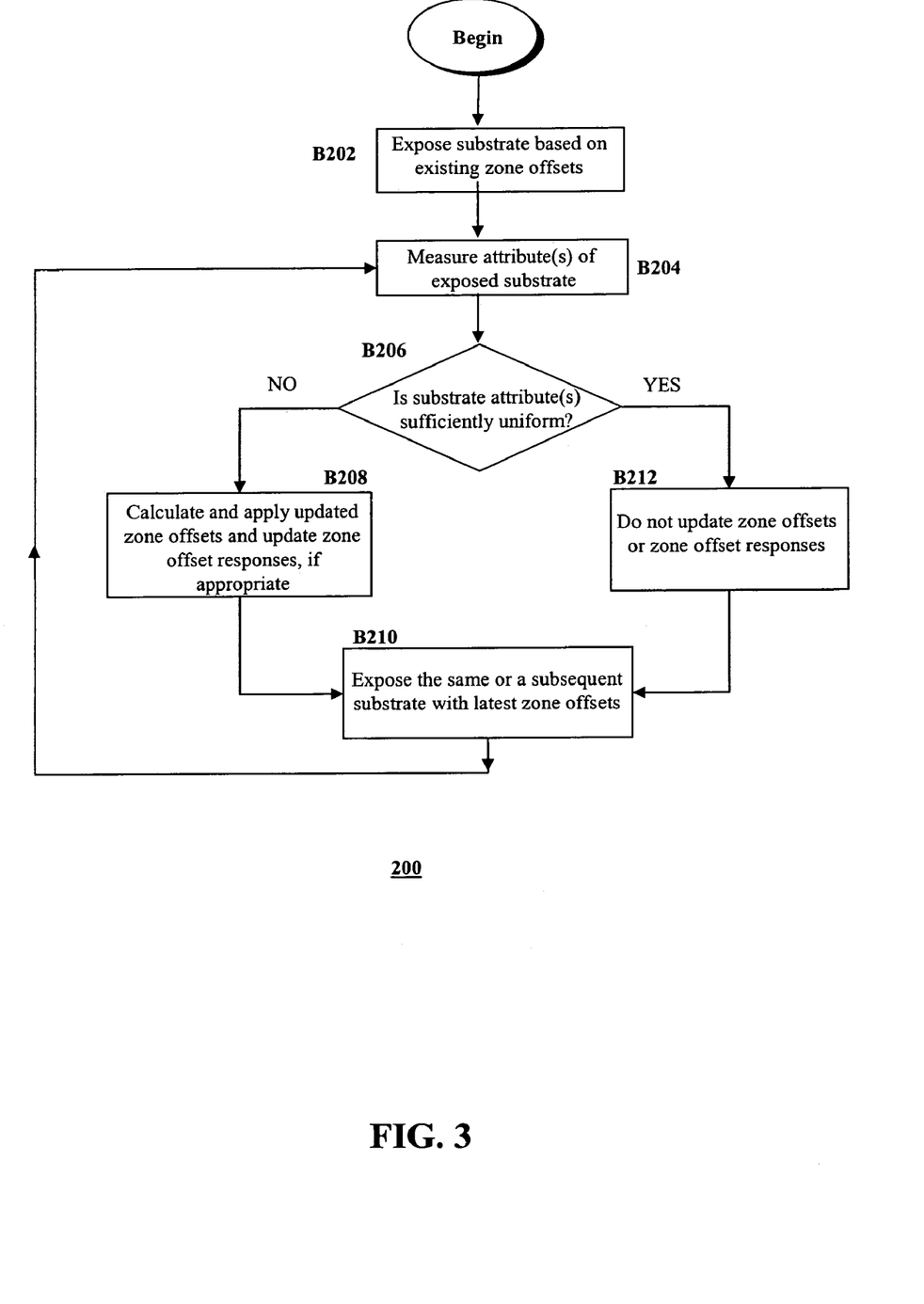
FIG. 3 is a high level flow diagram depicting an embodiment of the present invention.

FIG. 3 schematically depicts the general inventive concept of the substrate attribute enhancement process 200, constructed and operative in accordance with an embodiment of the present invention. As indicated in FIG. 3, enhancement process 200 commences with procedure task B202 which, via a lithographic exposure apparatus 102, exposes a substrate in a process using a thermal plate having existing zone offsets. Associated with the substrate maybe substrate processing and configuration information such as pre-exposure substrate measurement data, exposure requirements and parameters, substrate track processing data that may include the path the substrate has or will travel and apparatus the substrate has been or will be processed with, substrate characteristics such as resist type and thickness, and metrology data. This processing and configuration information would be used in updating zone offsets. For example, the path information can identify which thermal plate(s) should have its zone offsets updated.

After exposing the substrate, values of one or more attributes of the exposed substrate are measured in procedure task B204. Measurement task B204 may be configured to measure and assess one or more various substrate attributes including, for example, average feature size of the entire substrate, size of the individual target fields, thickness of the resist, thickness of the anti-reflective coating, the gap between features, X & Y diameter of holes and/or posts, ellipticity of holes and/or posts, area of a feature, feature sidewall angle, width at the top of a feature, width at the middle of a feature, width at the bottom of a feature, line edge roughness, etc. As used herein, the values of the measured attributes include not only the actual value of the measured attribute but may also include the spatial location of the measured value on the substrate. The measurements may be performed using any suitable equipment, such as a scanning electron microscope (SEM), a spectroscopic ellipsometer, a reflectometer, an electric line width measurement tool (ELM), a focused ion beam (FIB) measurement tool, an e-beam measurement tool, an atomic force microscope (AFM), a scatterometer, a defect inspection tool, and/or an overlay measurement tool. Such measurement equipment may be provided in the exposure apparatus, in the substrate track, external to the exposure apparatus and substrate track, or any combination of the foregoing.

Based on the measured values of the attribute(s) of the exposed substrate, procedure task B206 determines whether the attribute(s) of the substrate is sufficiently uniform. The sufficiency of attribute uniformity may be based one or more profile metrics or characteristics, such as attribute value range, attribute value standard deviation, and average attribute value range between fields. If the substrate is sufficiently uniform, as specified by the relevant profile information, no changes are needed to the zone offsets or to the zone offset responses (discussed in more detail below) at procedure task B212. Subsequent substrates will be processed with the existing zone offsets and zone offset responses.

If, on the other hand, the exposed substrate is not sufficiently uniform, process 200 progresses to procedure task B208, where it compensates for the lack of attribute uniformity by calculating and applying one or more updated zone offsets to the one or more appropriate thermal plates, the updated zone offsets calculated to improve or control the attribute(s) uniformity. The associated substrate processing and configuration information may be used in this regard to determine, for example, which specific thermal plate(s) should have its zone offsets updated or whether the attribute uniformity is attributable to or could be corrected by updated zone offsets. In an embodiment, updated zone offsets may be specific and maintained with respect to the exposed substrate (or a group of substrates associated with the exposed substrate) and applied to the one or more thermal plates used to process that substrate (or group of substrates), based on the substrate processing and configuration information associated with the substrate (or group of substrates). Another substrate (or group of substrates) may have its own updated zone offsets based on its own substrate processing and configuration information.

Also, such zone offset calculations may have used zone offset responses (discussed in more detail below). The zone offset responses may be updated based on the values of the measured attribute(s) to improve subsequent calculation of corrective zone offsets for the same or subsequent substrates. Furthermore, corrections may be made to other substrate processing steps or apparatus. For example, the dose may re-configured and/or the exposure extended as discussed above. These corrections to other substrate processing steps or apparatus may be derived from the updated zone offsets or calculated independently.

In procedure task B210, the same or a subsequent substrate is exposed with the latest and/or its specific (for example, correlated to the substrate's history) corrective zone offsets applied to the thermal plate(s) used to process the substrate. After exposure, process 200 returns to procedure task B204 to measure values of one or more attributes of the exposed substrate (e.g., critical dimension (CD)), that was exposed with the corrective zone offsets in B210. Process 200 then iterates to procedure task B206 to determine substrate attribute(s) uniformity and, if not sufficiently uniform, updated corrective zone offsets are generated in task B208. Process 200 continues this iterative process until the exposed substrate(s) achieves the desired attribute(s) uniformity profile.

By adjusting the zone offsets, process 200 effectively converges on optimal zone offsets to factor out substrate attribute non-uniformities, resulting in improved attribute uniformity. So, for example, the substrate to substrate mean attribute repeatability can be improved, particularly in the case where attribute non-uniformity arises from multiple post-exposure bake plates.

In addition, process 200 continues to monitor the attribute uniformity level for changes over time and calculates and implements zone offset adjustments as required. For example, if the attribute uniformity drifts from the desired attribute uniformity, the process will identify this situation, calculate improved zone offsets, and apply them to continuously maintain optimal attribute uniformity.

In an embodiment, data gathered and decisions made during the process may be made available to the user electronically and/or visually to allow for manual or automatic monitoring of the system. In addition, the user may input information, and optimize the application of the process.

Further, the system and process according to an embodiment of the invention can takes advantage of existing process control data. No special tooling may be required and software is currently available to manually change zone offsets, which could be modified or used by another software program to provide the automated zone offsets correction as described herein.

Figure 4:
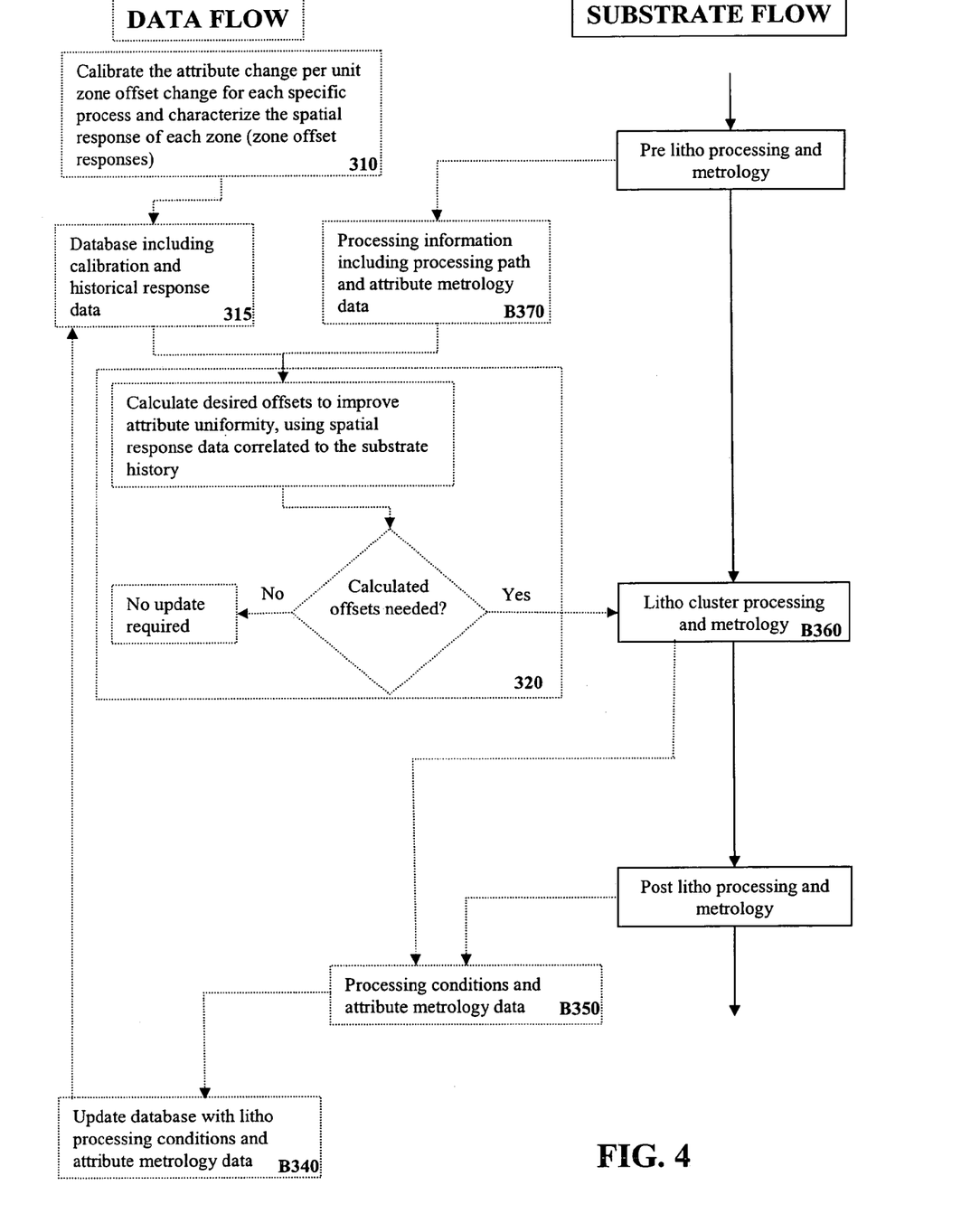
FIG. 4 is a schematic functional block diagram depicting an embodiment of the present invention.

FIG. 4 provides a schematic functional block diagram detailing certain features and aspects according to an embodiment of the invention. As depicted in FIG. 4, the attribute enhancement process utilizes a zone offset response calculation module 310, a zone offset determination module 320, and a database 315. These modules cooperate with each other in a manner to achieve the desired corrective zone offsets to improve or control substrate attribute uniformity. The modules may be implemented as software in the exposure apparatus, the substrate track, some other device (e.g., an advanced process control unit), or any combination of the forgoing. In an embodiment, the modules may be implemented as software or hardware in a controller for the thermal plate(s).

Zone offset response calculation module 310 relates to features and aspects regarding the determination of zone offset responses to be applied in determining applied zone offsets to improve or control attribute uniformity. The zone offset responses are formula and/or data used in calculating the zone offsets needed to effect improvement or control of attribute uniformity. For example, the zone offset responses may include, for each zone, a change of a value of an attribute per unit zone offset change in that zone.

In an embodiment, preliminary calculations are performed by the zone offset response calculation module 310 to determine baseline zone offset responses using known zone offsets. The zone offset responses are determined, for example, by exposing one or more substrates with a known history (e.g., how they were processed, what resists and other coatings are used on the substrate, etc.) and applying varied zone offsets for each zone of one or more thermal plates independently. In an embodiment, the one or more thermal plates are those in the production lithographic system but they alternatively may be different, but substantially similar, thermal plates to those used in the production lithographic system.

Similarly as discussed above, values of one or more attributes of the resulting one or more substrates are measured. From the measured attribute(s) values, zone offset responses are calculated 310. For example, the measured attribute change and the change of zone offsets may be correlated to provide zone offset response data that identifies the attribute change per unit zone offset change. The zone offset responses maybe determined per zone or averaged over a set of zones (or the entire thermal plate). Similarly, the zone offset responses may be determined per thermal plate or averaged of a set of thermal plates. In addition or alternatively, the zone offset responses may be specific to certain substrate configurations and processing. For example, a set of zone offset responses may be determined for substrates having a certain resist and/or processing conditions and another set of zone offset responses maybe determined for substrates having different resist and/or processing conditions. In addition or alternatively, the spatial response of each zone may factored into the zone offset response. In other words, cross-correlation and interaction between the zones may be factored since change in the zone offset of one zone may alter the response of another zone. The zone offset responses are provided to the zone offset determination module 320, via the database 315, for use in calculation of the zone offsets to be applied to one or more thermal plates.

In an embodiment, the zone offset response calculation module 310 may be eliminated where such or similar zone offset responses are simply provided to the zone offset determination module 320 to calculate the appropriate zone offsets to be applied to improve or control attribute uniformity. For example, basic zone offset responses may be supplied to the database 315 and available to the zone offset determination module 320 (e.g., initial assumptions about the change of a value of attribute per unit zone offset change, whether specific to each zone or generic to all zones) and possibly updated during operation of the zone offset determination module 320 based on, for example, the performance results of the zone offset determination module 320.

Zone offset determination module 320 relates to features and aspects of the applied zone offset determination functionality. The module includes logic which, as described in greater detail below, is configured to calculate zone offsets to improve or control attribute uniformity, determine whether such calculated zone offsets should be applied, and to update the zone offset responses as appropriate.

After exposure and thermal treatment using one or more thermal plates with existing zone offsets, values of one or more attributes of the one or more exposed substrates are measured and correlated with the path of travel through the lithographic system of the substrate(s) B370 (from, for example, the associated substrate processing and configuration information supplied to, retrieved by, or maintained in database 315). By correlating with the path of travel, the attribute values can be evaluated to determine what process and/or apparatus may be causing attribute non-uniformity. As discussed above, various attributes may be measured using any appropriate equipment, whether located in the track, in the lithographic exposure apparatus, or elsewhere.

With the attribute measurement data, the zone offset determination module 320 determines, as discussed in FIG. 2, whether the attribute(s) may be sufficiently uniform in accordance with a profile characteristic or metric, such as attribute range, attribute standard deviation, or average attribute range between fields. If the attribute(s) is not sufficiently uniform, one or more desired zone offsets are calculated that could be applied to appropriate one or thermal plates to improve or control attribute uniformity of the substrate(s). In particular, the zone offset determination module 320 can use the zone offset responses, supplied by the zone offset response database 315 or that are otherwise available, and the measured values of the attribute(s) to increase or decrease the existing zone offsets of the thermal plate(s) to arrive at desired zone offsets for the thermal plate(s) to improve or control attribute uniformity. As discussed above, substrate processing and configuration information associated with the substrate, such as the path of the substrate, may be used by zone offset determination module 320 in this regard to determine, for example, which specific thermal plate(s) should have its zone offsets updated or whether the attribute uniformity is attributable to or could be corrected by updated zone offsets.

In an embodiment, updated zone offsets may be specific and maintained with respect to the exposed substrate (or a group of substrates associated with the exposed substrate) and applied to the one or more thermal plates used to process that substrate (or group of substrates), based on the substrate processing and configuration information associated with the substrate (or group of substrates). Another substrate (or group of substrates) may have its own updated zone offsets based on its own substrate processing and configuration information. So, for example, the zone offset determination module 320 may correlate the substrate processing and configuration information with the zone offsets information stored in the zone offsets database 315, the database 315 maintaining zone offsets per substrate or groups of substrates, to determine the corresponding zone offsets that will be used in the processing of the substrate. Initially, the existing zone offsets would be used and perhaps stored in the zone offsets database 315. However, after the initial processing, the zone offset determination module 320 would correlate the substrate processing and configuration information with the appropriate corresponding zone offsets stored in the database 315, update the database 315 through B340 with updated zone offsets, and otherwise monitor and verify changes to the zone offsets.

The calculated zone offsets may then be evaluated to determine whether the actual zone offsets should be applied to the thermal plate(s) and/or whether a maintained set of zone offsets, such as where specific zone offsets are maintained with respect to the substrate (or a group of substrates), should be updated. For example, the desired zone offsets may not be substantially different than the existing zone offsets at a thermal plate and/or substantially different than the existing zone offsets maintained for the substrate (or group of substrates). Further, the desired zone offsets may not be supplied to the thermal plate(s) because, for example, the substrate will not be processed any further or the thermal plate(s) should not be updated for technical reasons.

If the decision is to apply the desired zone offsets to the thermal plate(s), the zone offset determination module 320 makes the desired zone offsets available to the thermal plate(s) by, for example, electronically sending them to a substrate track containing the thermal plate(s) B360. Similarly, if the decision is to update a maintained set of zone offsets, the zone offset determination module 320 can do so. In an embodiment, one or more best thermal plate may be determined from the attribute(s) measurement data and all or a significant amount of substrates are then rescheduled to pass through the best thermal plate. The best thermal plate(s) may have updated zone offsets applied to improve performance.

Also, such zone offset calculations may have used zone offset responses (i.e., formula and/or data used in calculating the zone offsets needed to effect improvement or control of attribute uniformity). For example, the measured values of the attribute(s) of the substrate may be compared to expected or previously measured values of the attribute(s) of the same or a related substrate to determine whether previously applied zone offsets achieved improvement in attribute(s) uniformity. If the expected or previously measured values of the attribute(s) did not match or correlate with the actual measured values of the attribute(s), the zone offset responses may be updated to improve subsequent calculation of corrective zone offsets for the same or subsequent substrates. So, where, for example, the zone offset response includes a change of a value of an attribute per unit zone offset change in a particular zone and the actual measured value of the attribute fell short of the expected value of the attribute, the change of value of the attribute per unit zone offset change in the zone may be increased proportionally to the amount the actual measured value of the attribute fell short of the expected value of the attribute.

Furthermore, corrections may be made to other substrate processing steps or apparatus. For example, the dose may re-configured and/or the exposure extended as discussed above in view of the updated zone offsets B360. Furthermore or alternatively, corrections may be in a etch tool or substrate processing step. These corrections to other substrate processing steps or apparatus may be derived from the updated zone offsets (e.g., by formula or lookup table) or calculated independently. The zone offset determination module 320 makes these further corrections available to the appropriate apparatus by, for example, electronically sending them to a substrate track and/or an exposure apparatus.

A substrate track and/or an exposure apparatus may then apply the updated zone offsets to one or more thermal plate(s) which process the substrate(s), the thermal plate(s) being in or controlled by the substrate track and/or exposure apparatus B360. In addition or alternatively, the substrate track and/or the exposure apparatus may apply corrections derived from the updated zone offsets calculations to update one or more other processing steps or apparatus used to process the substrate(s), the thermal plate(s) being in or controlled by the substrate track and/or exposure apparatus B360. As will be apparent, the substrate(s) may move between the substrate track and the exposure apparatus and thus updated zone offsets should be carefully applied to one or both of the substrate track and the exposure apparatus so as to avoid over compensation. One or more attributes of the substrate(s) processed by the exposure apparatus and/or the substrate track is then measured again B350 and the process repeats again to iteratively revise the zone offsets and converge to optimal corrective zone offsets. In doing so, the substrate attribute(s) non-uniformities occurring across a target field, across a substrate, and between substrates can be effectively corrected to yield the desired attribute uniformity profile.

Updated substrate processing and configuration information and measurements of attribute value(s) for the substrate(s), including substrate processing path and substrate attribute(s) metrology data such as measured at B350, may be supplied B340 back (from the exposure apparatus, substrate track, etc.) to the zone offsets determination module 320 for subsequent use in determining updated zone offsets for a substrate. The updated substrate processing and configuration information may include (1) dose, time, recipe, and exposure settings from the exposure apparatus, (2) thermal plate(s) and bowl(s) used, pre-processing applied, recipe, temperature, time and other processing information from the substrate track, and (3) substrate attribute values from measurement equipment.

Figure 5:
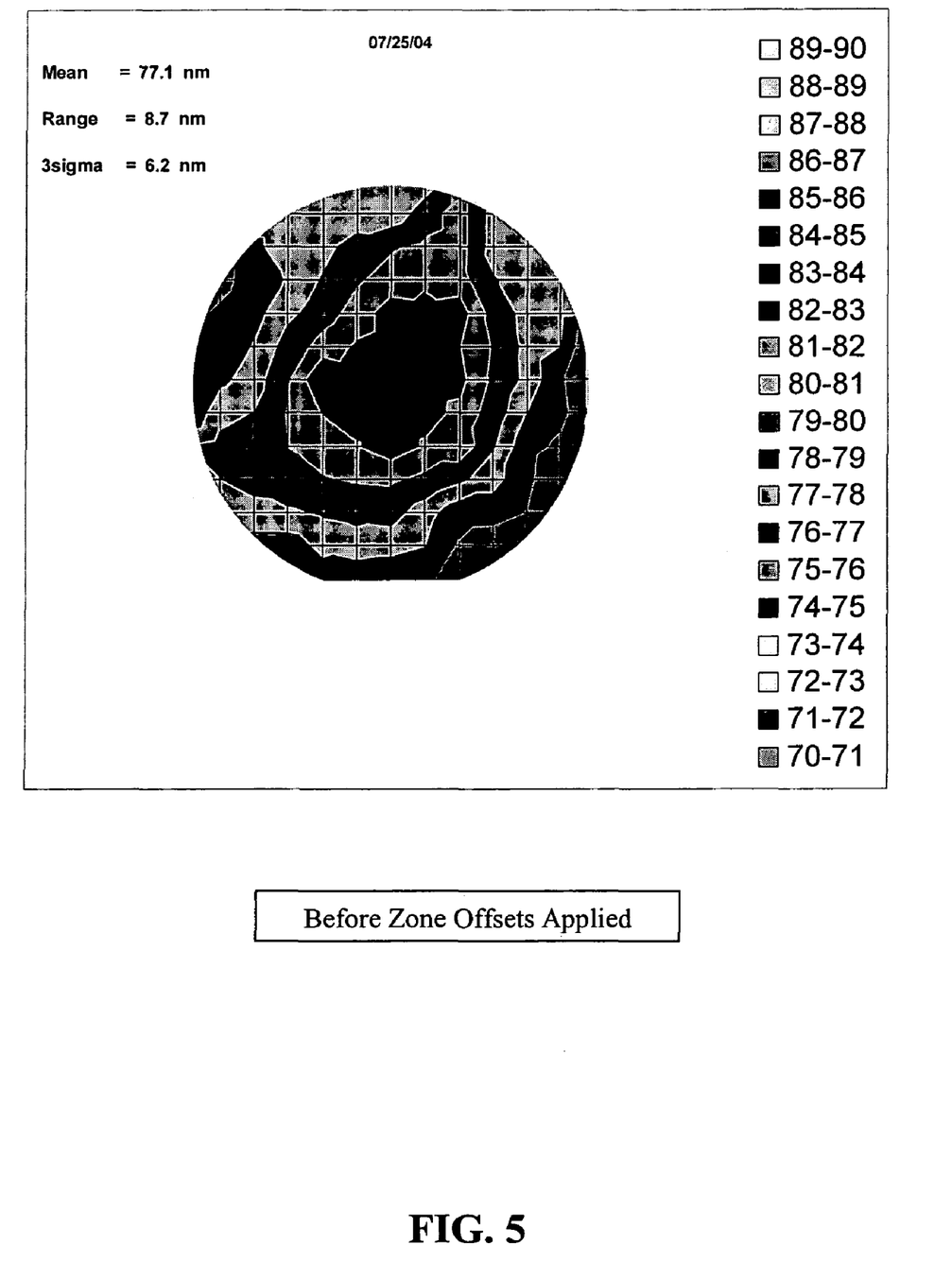
FIG. 5 illustrates a schematic layout of attribute values of substrate after the substrate was processed using a Tokyo Electron post-exposure bake plate calibrated as supplied.

FIG. 5 illustrates a schematic layout of attribute values of substrate after the substrate was processed using a Tokyo Electron post-exposure bake plate calibrated as supplied. The bake plate is that from a 200 mm Tokyo Electron ACT8 substrate track, the bake plate having 7 separate zones, each with offsets stored within the controller that can be manually adjusted. The substrate track was interfaced to an ASML PAS 5500/1150 lithographic exposure apparatus, which exposed the substrates.

Figure 6:
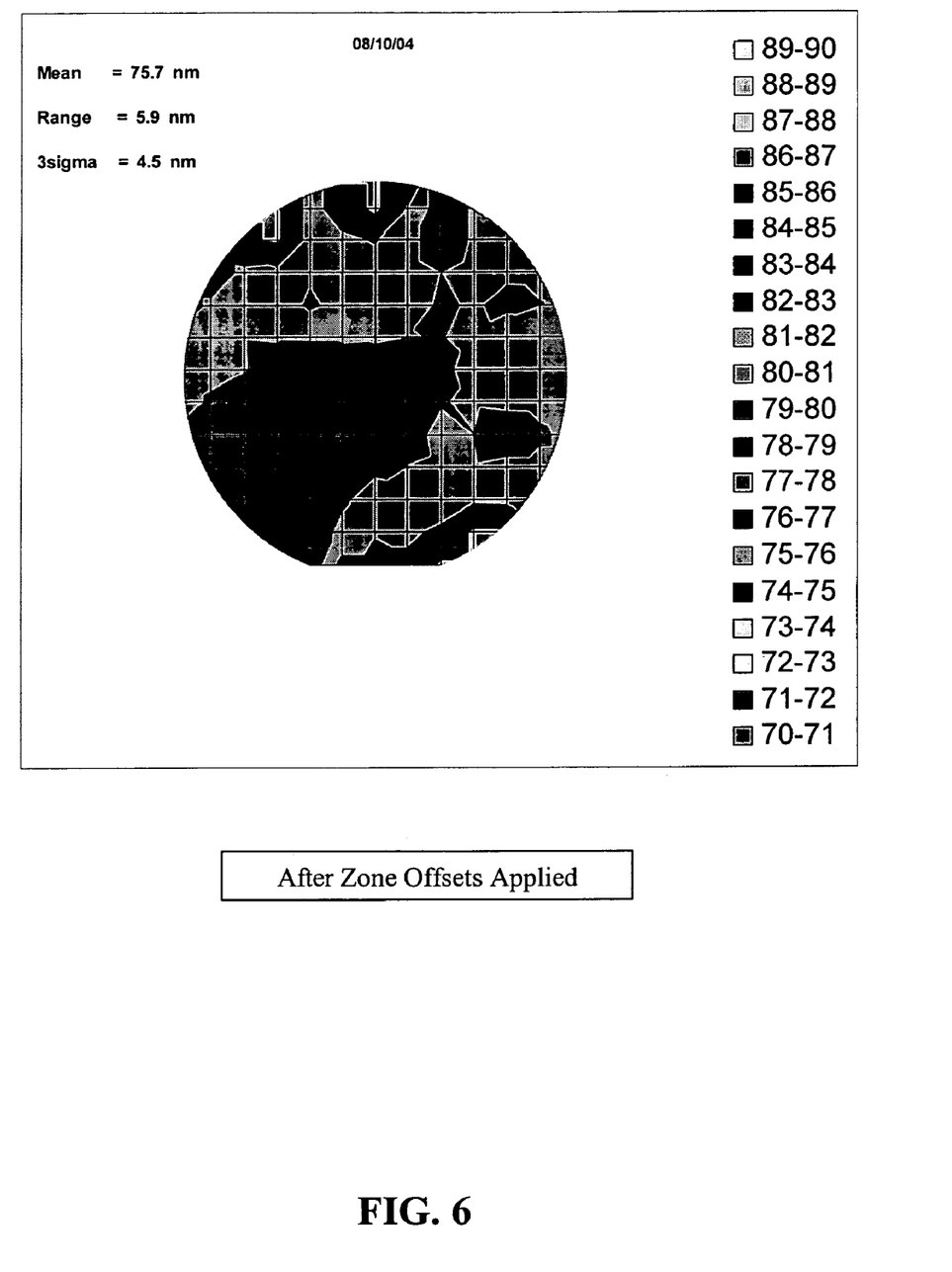
FIG. 6 illustrates a schematic layout of attribute values of the same substrate of FIG. 5 after that substrate was processed using the same Tokyo Electron post-exposure bake plate calibrated as supplied but corrected according to an embodiment of the invention.

FIG. 6 illustrates a schematic layout of attribute values of the same substrate of FIG. 5 after that substrate was processed using the same Tokyo Electron post-exposure bake plate calibrated as supplied but corrected according to an embodiment of the invention. In other words, the zone offsets of one or more of the 7 individual zones of the bake plate were updated according to an embodiment of the present invention to yield improved substrate attribute uniformity (approximately 27%) for substrates heated on that bake plate.

While the description herein has been in relation zone offsets, it will be appreciated that an embodiment of the invention will be applicable to any zone parameter or more generally corrective data to change the performance of all or parts of a thermal plate.

Although specific reference may be made herein to the use of lithographic exposure apparatus in the manufacture of ICs, it should be understood that the lithographic exposure apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to any device that can be used to impart a beam with a pattern in its cross-section such as to create a pattern in a target portion of the substrate. It should be noted that the pattern imparted to the beam may not exactly correspond to the desired pattern in the target portion of the substrate. Generally, the pattern imparted to the beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device in a way depending on the orientation of the patterning device, the design of the lithographic exposure apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may be referred to below, collectively or singularly, as a "lens".

The lithographic exposure apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic exposure apparatus may also be of a type wherein a surface of the substrate is immersed in a liquid having a relatively high refractive index, e.g. water, so as to fill a space between a final element of the projection system and the substrate. Immersion liquids may also be applied to other spaces in the lithographic exposure apparatus, for example, between the patterning device and a first element of the projection system. Immersion techniques are well known in the art for increasing the numerical aperture of projection systems.

The methods described herein may be implemented as software, hardware or a combination. In an embodiment, there is provided a computer program product comprising program code that, when executed on a computer, instructs the computer to perform any or all of the methods described herein. The computer program product may be, for example, a CD incorporating the program code, a hard drive or other memory in an apparatus that incorporated the program code, etc.

The description herein refers to the accompanying drawings that illustrate exemplary embodiments consistent with the invention. Other embodiments are possible and modifications may be made to the embodiments without departing from the spirit and scope of the invention. As such, the configuration, operation and behavior of the present invention will be described with the understanding that modifications and variations of the embodiments are possible, given the level of detail present herein. Thus, the description and/or accompanying drawings herein are not meant or intended to limit the invention—rather the scope of the invention is defined by the appended claims.

What is claimed is:

1. A method comprising:
    characterizing a temperature response for one or more zones of a thermal plate based on an application of different temperature zone offsets to each of the one or more zones of the thermal plate during exposure of a first pattern on a surface of a substrate;
    measuring a value of an attribute of a second pattern exposed on the surface of the substrate;
    calculating corrective data based on the measured value of the attribute of the second pattern exposed on the surface of the substrate, the corrective data at least partially correcting non-uniformity of the value of the attribute of the second pattern exposed on the surface of the substrate; and
    controlling temperature of the one or more zones of the thermal plate, wherein the thermal plate is used to heat or cool the substrate during the lithographic exposure process based on the corrective data.

2. The method of claim 1, wherein the attribute is a critical dimension of a feature on the exposed substrate.

3. The method of claim 1, wherein the attribute is at least one of a sidewall angle, a line edge roughness, a post diameter, a contact size, a line width, a space width, and an alignment position of a feature on the exposed substrate.

4. The method of claim 1, further comprising heating the substrate in accordance with the corrective data.

5. The method of claim 1, wherein the thermal plate comprises a post-exposure bake plate configured to heat the substrate after exposure of the substrate with the second pattern.

6. The method of claim 1, further comprising:
    assessing whether the measured value of the attribute is sufficiently uniform based on substrate profile information; and
    upon determining that the measured value of the attribute is not uniform, calculating the corrective data.

7. The method of claim 1, wherein the characterizing the temperature response comprises determining a zone offset response used in calculating the corrective data, the zone offset response comprising a measure of change of a substrate attribute value per unit of zone offset change.

8. The method of claim 1, further comprising updating a zone offset response, used in calculating the corrective data, based on the measured value of the attribute.

9. The method of claim 1, wherein the calculating the corrective data comprises using substrate processing and configuration information, the substrate processing and configuration information including at least one of data associated with a processing path of the substrate through one or more processing apparatus, pre-exposure measurement data, and exposure requirements and parameters.

10. The method of claim 1, further comprising controlling one or more lithographic processing apparatus used after the heating or cooling by the thermal plate in a lithographic exposure process based on the corrective data.

11. The method of claim 1, wherein the characterizing the temperature response comprises:
exposing the first pattern on the surface of the substrate, wherein the first pattern has a known process history;
measuring an attribute associated with the first pattern;
correlating the attribute associated with the first pattern to a change in a corresponding zone offset; and
calculating a change in the attribute associated with the first pattern per unit zone offset change.

12. A computer readable program product, embodied in a tangible medium, encoded with instructions that, if executed by a computing device causes the computing device to perform a method comprising:
characterizing a temperature response for one or more zones of a thermal plate based on an application of different temperature zone offsets to each of the one or more zones of the thermal plate during exposure of a first pattern on a surface of a substrate;
calculating corrective data based on a value of an attribute of a second pattern exposed on the surface of the substrate the corrective data at least partially correcting non-uniformity of the value of the attribute of the second pattern exposed on the surface of the substrate; and
controlling temperature of the one or more zones of the thermal plate, wherein the thermal plate is used to heat or cool the substrate based on the corrective data.

13. The computer program product of claim 12, wherein the attribute is a critical dimension of a feature on the exposed substrate.

14. The computer program product of claim 12, wherein the attribute is at least one of a sidewall angle, a line edge roughness, a post diameter, a contact size, a line width, a space width, and an alignment position of a feature on the exposed substrate.

15. The computer program product of claim 12, wherein the thermal plate comprises a post-exposure bake plate configured to heat the substrate after exposure of the substrate with the second pattern.

16. The computer program product of claim 12, wherein the method further comprises:
measuring the value of the attribute of the second pattern exposed on the surface of the substrate;
assessing whether the measured value of the attribute is sufficiently uniform based on substrate profile information; and
upon determining that the measured value of the attribute is not uniform, calculating the corrective data.

17. The computer program product of claim 12, wherein the characterizing the temperature response comprises determining a zone offset response used in calculating the corrective data, the zone offset response comprising a measure of change of an attribute value per unit of zone offset change.

18. The computer program product of claim 12, wherein the method further comprises updating a zone offset response, used in calculating the corrective data, based on the measured values of the attribute.

19. The computer program product of claim 12, wherein the calculating the corrective data comprises using substrate processing and configuration information, the substrate processing and configuration information including at least one of data associated with a processing path of the substrate through one or more processing apparatus, pre-exposure measurement data, and exposure requirements and parameters.

20. The computer readable program product of claim 12, wherein the method further comprises controlling one or more lithographic processing apparatus used after the heating or cooling by the thermal plate in a lithographic exposure process based on the corrective data.

21. A thermal plate system, comprising:
a thermal plate configured to heat or cool a substrate and comprising a plurality of zones; and
a controller configured to:
characterize a temperature response for a plurality of zones of a thermal plate based on an application of different temperature zone offsets to each of the plurality of zones of the thermal plate during exposure of a first pattern on a surface of a substrate; and
calculate corrective data based on a measured value of an attribute of a second pattern exposed on the surface of the substrate and to control temperature generated by a zone of the plurality of zones based on the corrective data, the corrective data configured to at least partially correct non-uniformity of the value of the attribute of the second pattern exposed on the surface of the substrate.

22. The thermal plate system of claim 21, wherein the thermal plate comprises a post-exposure bake plate configured to heat the substrate after exposure of the substrate with the second pattern by the lithographic exposure apparatus.

23. The thermal plate system of claim 21, wherein the attribute is a critical dimension of a feature on the exposed substrate.

24. The thermal plate system of claim 21, wherein the attribute is at least one of a sidewall angle, a line edge roughness, a post diameter, a contact size, a line width, a space width, and an alignment position of a feature on the exposed substrate.

25. The thermal plate system of claim 21, wherein the controller is configured to control one or more lithographic processing apparatus used after the heating or cooling by the thermal plate in the lithographic exposure process based on the corrective data.

26. A lithographic apparatus, comprising:
a projection system configured to project a patterned beam of radiation onto a substrate;
a substrate holder configured to hold the substrate;
a thermal plate configured to heat or cool a substrate and comprising a plurality of zones; and
a controller configured to:
characterize a temperature response for the plurality of zones of the thermal plate based on an application of different temperature zone offsets to each of the plurality of zones of the thermal plate during exposure of a first pattern on a surface of the substrate; and
calculate corrective data based on a sensor measured value of an attribute of a second pattern exposed on the surface of the substrate, to control temperature generated by a zone of the plurality of zones based on the corrective data, the corrective data configured to at least partially correct non-uniformity of the value of the attribute of the second pattern exposed on the surface of the substrate.

27. The apparatus of claim 26, further comprising a measuring device configured to measure the attribute of the substrate.

28. The apparatus of claim 26, wherein the attribute is at least one of a critical dimension, a sidewall angle, a line edge roughness, a post diameter, a contact size, a line width, a space width, and an alignment position of a feature on the exposed substrate.

29. The lithographic apparatus of claim 26, wherein the controller is configured to control one or more lithographic processing apparatus used after the heating or cooling by the thermal plate in the lithographic exposure process based on the corrective data.

* * * * *